United States Patent

Saito

[11] Patent Number: 5,991,612
[45] Date of Patent: Nov. 23, 1999

[54] AMPLITUDE CORRECTION CIRCUIT

[75] Inventor: Masahisa Saito, Yokohama, Japan

[73] Assignee: Kabushiki Kaisha Toshiba, Kawasaki, Japan

[21] Appl. No.: 08/821,446

[22] Filed: Mar. 21, 1997

[30] Foreign Application Priority Data

Mar. 22, 1996 [JP] Japan .................................. 8-066437

[51] Int. Cl.$^6$ ................................ H04B 1/06; H04B 1/16
[52] U.S. Cl. .................................. 455/234.1; 455/192.2; 455/343
[58] Field of Search ...................... 455/234.1, 234.2, 455/250.1, 254, 264, 310, 232.1, 313, 318, 333, 343, 192.1, 192.2; 330/250, 277, 278, 291

[56] References Cited

U.S. PATENT DOCUMENTS

| | | | |
|---|---|---|---|
| 4,641,368 | 2/1987 | Sullivan, Jr. ........................ | 455/250.1 |
| 4,928,314 | 5/1990 | Grandfield et al. .................... | 455/318 |
| 5,001,776 | 3/1991 | Clark ................................. | 455/234.1 |
| 5,203,019 | 4/1993 | Rinderle ............................. | 455/234.1 |
| 5,239,683 | 8/1993 | Usui .................................. | 455/254 |
| 5,517,684 | 5/1996 | Fujita et al. ........................ | 455/250.1 |
| 5,732,242 | 3/1998 | Roth et al. .......................... | 455/234.1 |
| 5,758,270 | 5/1998 | Okanobu ............................. | 455/234.1 |

Primary Examiner—Dwayne D. Bost
Assistant Examiner—Quochien B. Vuong
Attorney, Agent, or Firm—Finnegan, Henderson, Farabow, Garrett & Dunner, L.L.P.

[57] ABSTRACT

With the circuit construction of a heterodyne receiver, a control circuit for correcting the amplitude level of a local oscillation signal according to an output signal of a detector circuit is connected to the output terminal of an amplifier for amplifying the local oscillation signal to set the amplitude level of the local oscillation signal input to the mixer to an adequate level.

17 Claims, 6 Drawing Sheets

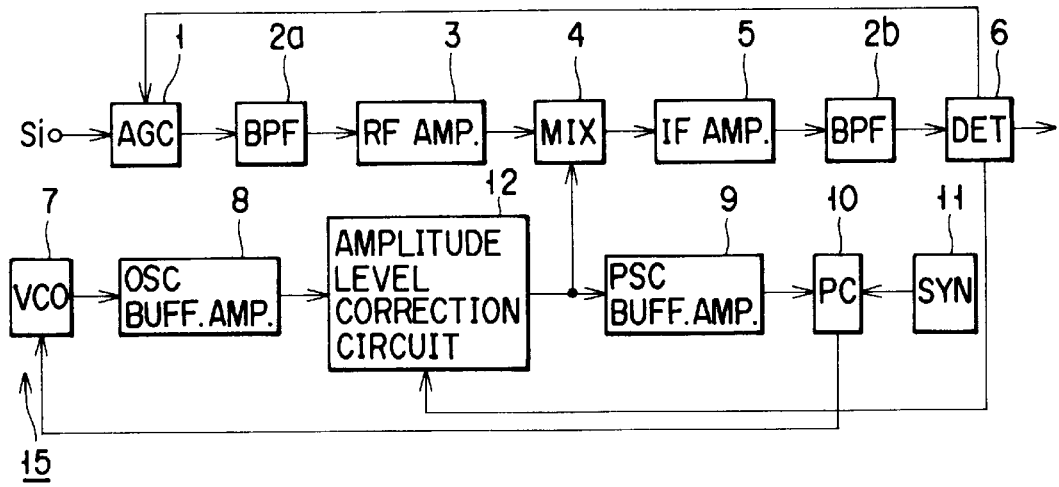
F I G. 6
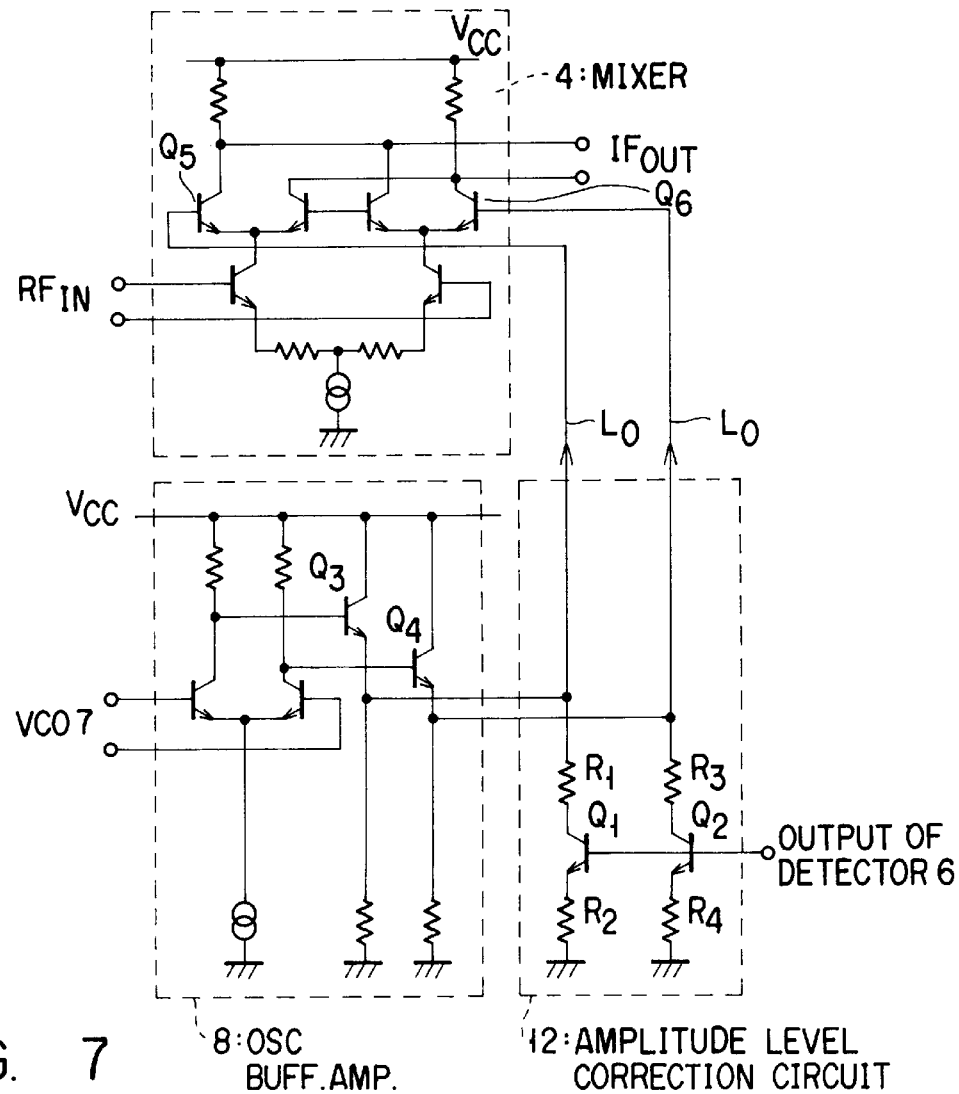
F I G. 7

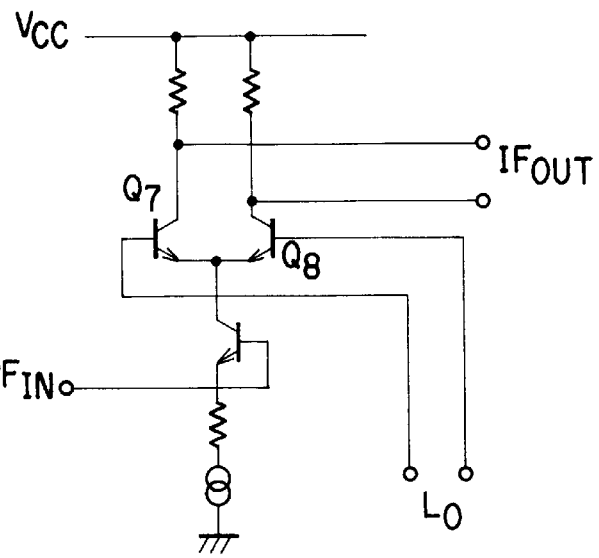
F I G. 8
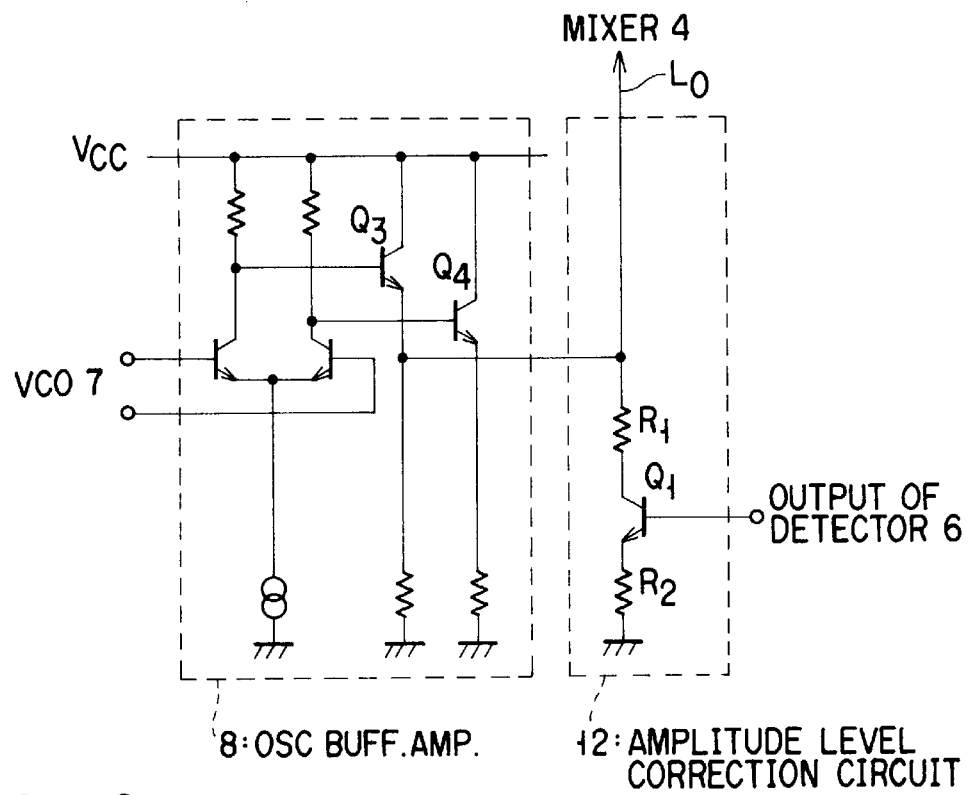
F I G. 9

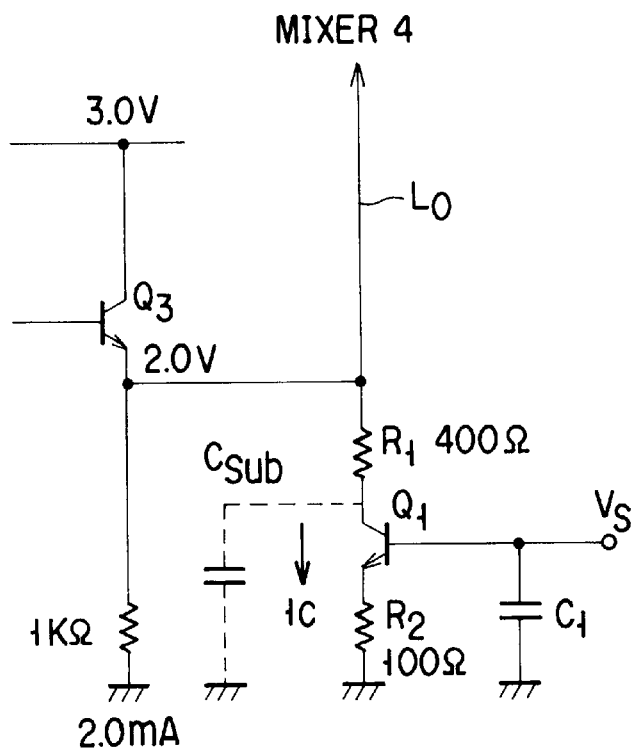
F I G. 13
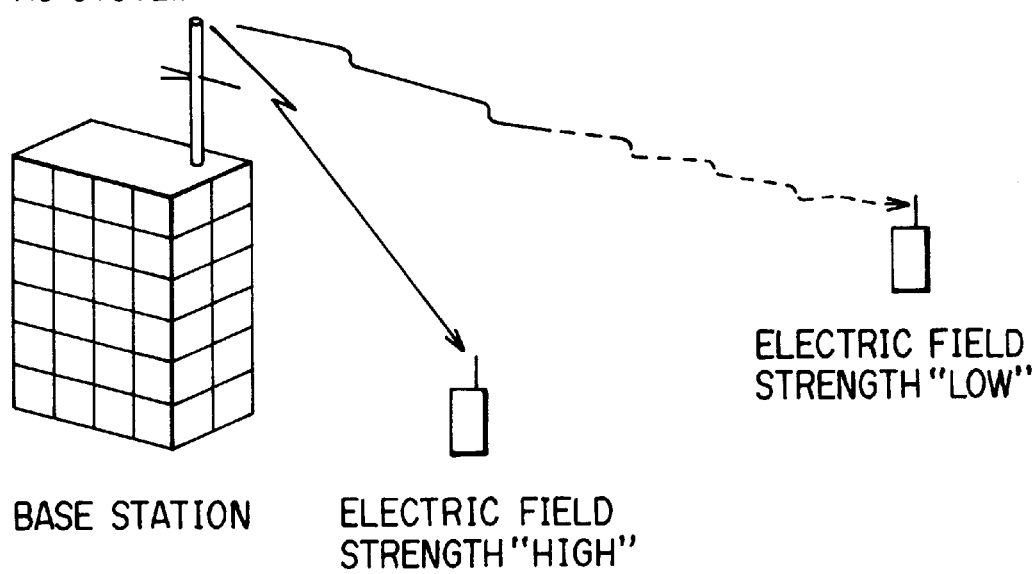
F I G. 14

AMPLITUDE CORRECTION CIRCUIT

BACKGROUND OF THE INVENTION

This invention relates to the circuit construction of a heterodyne receiver (including a super heterodyne receiver, double super heterodyne receiver, homodyne heterodyne receiver), and more particularly to correction of the amplitude of a local oscillation signal input to a frequency mixing circuit (including a single-balanced type mixer, double-balanced type mixer, single transistor type mixer, single FET type mixer) for processing a high-frequency signal.

FIG. 1 shows one example of the circuit construction of a conventional heterodyne receiver.

A local oscillator 15 constructed by a phase-locked loop (PLL) circuit includes a voltage-controlled oscillator (VCO) 7, OSC buffer amplifier 8, prescaler buffer amplifier 9, and phase comparator circuit 10. In the local oscillator 15, the VCO 7 creates a local oscillation signal in synchronism with a signal input from a frequency selection circuit 11. The buffer amplifier 8 amplifies the local oscillation signal supplied from the VCO 7 and supplies the amplified signal to a frequency mixing circuit (which is hereinafter simply referred to as a mixer) 4.

A received high frequency input signal Si is supplied to a band-pass filter (BPF) 2a via an automatic gain control (AGC) circuit 1 whose gain is controlled based on an output of a detector 6. An output signal of the band-pass filter 2a is amplified by a high frequency amplifier (RF Amp) 3 and input to the mixer 4. In the mixer 4, the amplified high frequency input signal and the local oscillation signal from the buffer amplifier 8 are mixed and an intermediate frequency signal is output. The intermediate frequency signal is amplified by an intermediate frequency amplifier (IF Amp) 5 and input to the detector 6 via a band-pass filter 2b which passes the intermediate frequency signal.

FIG. 2 shows an example of a circuit of the mixer 4 and the buffer amplifier 8. In the circuit of FIG. 2, a double-balanced type mixer circuit is used as the mixer 4. The amplitude level of a signal output from the buffer amplifier 8 to the double-balanced type mixer 4 is determined by the circuit construction of the buffer amplifier 8 and the circuit constants thereof.

In the buffer amplifier 8, the load impedance as viewed from the output terminal of an emitter follower circuit, that is, from a point "b" in FIG. 2 is a combination of the input impedance of a mixer circuit 13 and the input impedance of the prescaler buffer amplifier 9 and is generally low. Therefore, the dynamic ranges of transistors Q3, Q4 of the emitter follower circuit are narrowed and the output waveform of the buffer amplifier 8 is clipped. FIG. 3 shows a waveform (indicated by a solid line) at the circuit point "a" and a waveform (indicated by broken lines) at the circuit point "b" which is the output terminal of the emitter follower circuit. The waveform at the circuit point "b" corresponds to a waveform obtained by clipping the waveform at the circuit point "a".

Since the heterodyne receiver acts as a distributed constant circuit in the high-frequency bandwidth, it becomes necessary to take the parasitic capacitor and inductance into consideration as the impedance.

FIG. 4 shows the relation between the amplitude level (voltage) of the local oscillation signal input to the mixer 4 and the conversion gain of the mixer 4 and IP3 characteristic (third inter-modulation distortion). As is clearly seen from FIG. 4, as the amplitude level of the local oscillation signal becomes higher, the conversion gain becomes larger to some extent, but if the amplitude level of the local oscillation signal is further enhanced, the conversion gain becomes smaller. Further, as the amplitude level of the local oscillation signal becomes lower, the modulation distortion becomes smaller. The optimum amplitude level of the local oscillation signal lies between the circuit points "a" and "b" in FIG. 4, for example.

FIG. 5 shows the relation between the frequency of a high-frequency input signal and the conversion gain of the mixer when V1, V2, V3, V4 (V4<V3<V2<V1) are used as parameters. As shown in FIG. 5, the rate of a variation in the conversion gain with a variation in the high-frequency input signal is changed by changing the amplitude level of the local oscillation signal as a parameter. In order to attain a preferable conversion gain, it becomes necessary to set the amplitude level of the local oscillation signal higher as the frequency of the high-frequency input signal is set higher.

At the time of circuit design, it is necessary to determine the driving ability of the emitter follower circuit of the buffer amplifier 8 so as to set the amplitude level of the local oscillation signal into a region between "a" and "b" of FIG. 4 by taking the above-described fact into consideration and carrying out complicated calculations. The driving ability is determined based on the circuit construction and the circuit constants. Since the driving ability cannot be changed once it is determined, the amplitude level of the local oscillation signal from the buffer amplifier 8 is also fixed.

Further, even if the amplitude level of the local oscillation signal is set to an optimum value at a certain frequency, the reactance component changes and the load impedance changes if the frequency is changed, and therefore, the optimum value of the amplitude level is changed. For this reason, when the frequency of the local oscillation signal is wide band, it becomes necessary to attain the amplitude level of "a" in FIG. 4 in the high frequency range and attain the amplitude level of "b" in FIG. 4 in the low frequency range, and in order to meet the above requirement, it is necessary to make a careful study at the time of circuit design.

Because of the circuit construction, it is necessary to fix the amplitude level of the local oscillation signal input to the mixer 4 and it is impossible to change the same, and therefore, the current cannot be reduced and the power consumption cannot be lowered.

Further, even if the intensity of the high-frequency input signal which the heterodyne receiver receives becomes higher, the amplitude level of the high-frequency input signal is controlled by the AGC circuit so as to be set to a constant value, and therefore, it becomes impossible to reduce the current consumed in the mixer 4.

BRIEF SUMMARY OF THE INVENTION

In order to solve the above problem, an object of this invention is to provide an amplitude correction circuit for enhancing the reliability of the operation and lowering the power consumption by adequately operating the mixer of a heterodyne receiver according to the frequency of a high-frequency input signal.

With this invention, with the circuit construction of a heterodyne receiver, a control circuit for correcting the amplitude level of a local oscillation signal according to an output signal of a detector circuit is connected to the output terminal of an amplifier for amplifying the local oscillation signal to set the amplitude level of the local oscillation signal input to the mixer to an adequate level.

According to the present invention, there is provided an amplitude correction circuit comprising: oscillating means for generating a local oscillation signal; amplifying means for amplifying the local oscillation signal generated from the oscillating means; mixing means for combining the local oscillation signal amplified by the amplifying means with a high-frequency input signal to create an intermediate frequency signal; detecting means for detecting the intermediate frequency signal output from the mixing means; and control means connected between the amplifying means and the mixing means, for controlling the amplitude level of the local oscillation signal according to an output signal of the detecting means.

The amplifying means may include an emitter follower circuit at the output stage thereof.

The control means may include a transistor having a collector connected to the local oscillation signal input terminal of the mixing circuit and the output terminal of the emitter follower circuit via a first resistor, an emitter grounded via a second resistor, and a base supplied with an output signal of the detector circuit.

The amplifying means may include a pair of emitter follower circuits at the output stage thereof and the control means may include a pair of transistors respectively connected between a reference potential node and output terminals of the pair of emitter follower circuits and controlled by an output of the detecting means.

The amplifying means may include a pair of emitter follower circuits at the output stage thereof and the control means may include a transistor connected between a reference potential node and an output terminal of one of the pair of emitter follower circuits and controlled by an output of the detecting means.

The amplifying means may include a pair of emitter follower circuits at the output stage thereof and the control means may include a first transistor having a collector connected to the local oscillation signal input terminal of the mixing circuit and the output terminal of one of the emitter follower circuits via a first resistor, an emitter grounded via a second resistor, and a base supplied with an output signal of the detector circuit; and a second transistor having a collector connected to the local oscillation signal input terminal of the mixing circuit and the output terminal of the other emitter follower circuit via a third resistor, an emitter grounded via a fourth resistor, and a base supplied with an output signal of the detector circuit.

The amplifying means may include a pair of emitter follower circuits at the output stage thereof and the control means may include a transistor having a collector connected to the local oscillation signal input terminal of the mixing circuit and the output terminal of one of the emitter follower circuits via a first resistor, an emitter grounded via a second resistor, and a base supplied with an output signal of the detector circuit.

The mixing means may include a double-balanced type differential amplifier.

The mixing means may include a single-balanced type differential amplifier.

The mixing means may include a single bipolar transistor.

The mixing means may include a single FET of dual gate type.

The control means may lower the amplitude of the local oscillation signal according to an output signal of the detecting means when the strength of a received high-frequency input signal is higher than a preset strength and may increase the amplitude of the local oscillation signal according to an output signal of the detecting means when the strength of the received high-frequency input signal is lower than the preset strength.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a block diagram showing the circuit construction of a heterodyne receiver having an amplitude level correction circuit 12 according to an embodiment of this invention;

FIG. 7 is a circuit diagram showing the detail circuit construction of the amplitude level correction circuit 12, OSC buffer amplifier 8 and mixer 4 in FIG. 6;

FIG. 8 is a circuit diagram showing a single-balanced type mixer;

FIG. 9 is a circuit diagram showing another example of the amplitude level correction circuit 12 shown in FIG. 7;

FIG. 13 is a circuit diagram showing only a portion which is extracted from the circuit construction of FIG. 7 and is necessary for illustrating the operation for correcting the amplitude level of the local oscillation signal; and FIG. 14 is a diagram showing a PHS system.

DETAILED DESCRIPTION OF THE INVENTION

There will now be described an embodiment of this invention with reference to the accompanying drawings.

Figure 1:
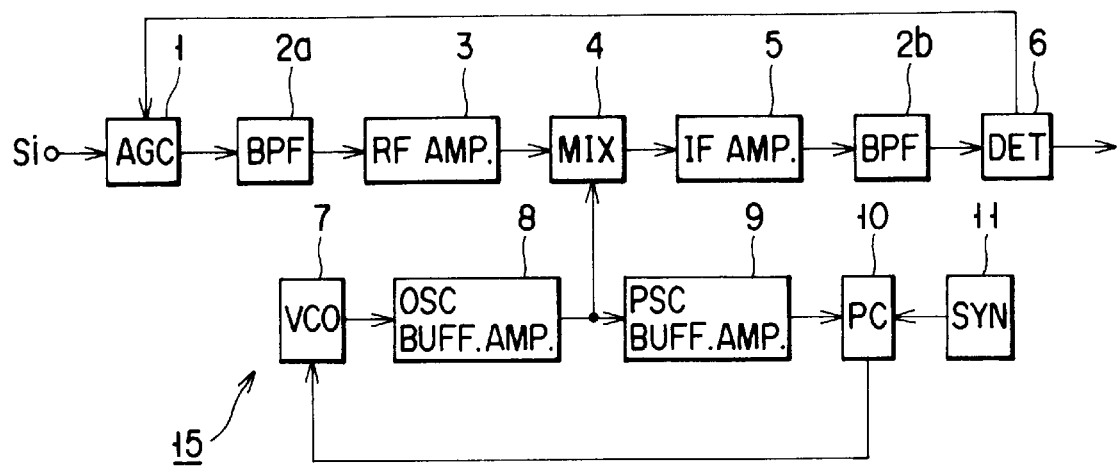
FIG. 1 is a block diagram showing the circuit construction of a conventional heterodyne receiver.
Figure 2:
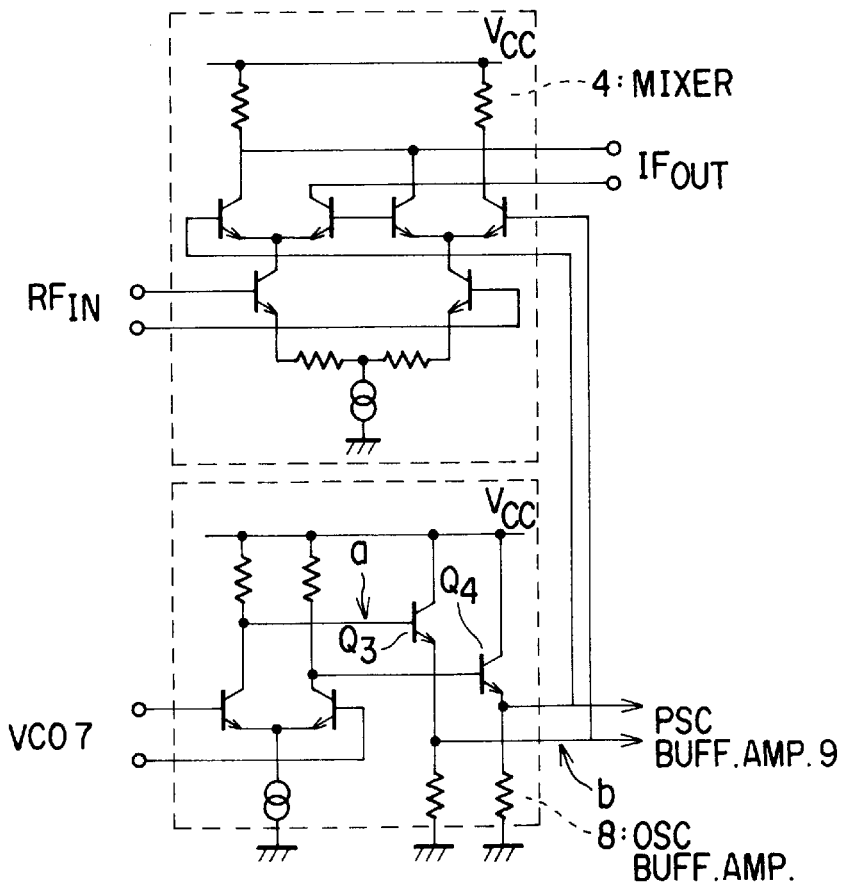
FIG. 2 is a circuit diagram showing a double-balanced type mixer 4 which is a frequency mixing circuit and a local oscillator buffer amplifier 8.
Figure 3:
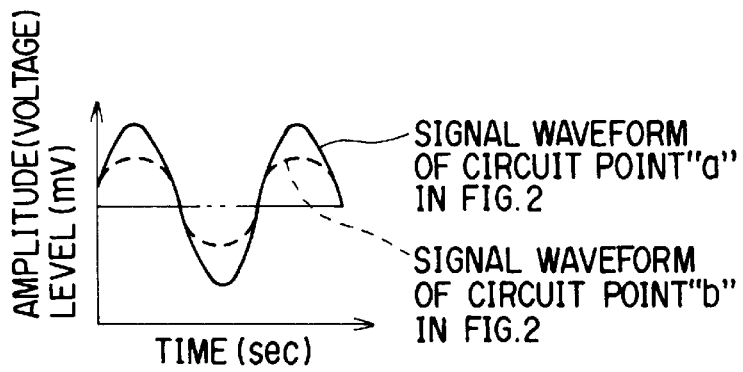
FIG. 3 is a diagram showing the amplitude level at an output point "a" of the buffer amplifier and the amplitude level at an output point "b" of an emitter follower in the circuit of FIG. 2.

FIG. 6 shows the circuit construction of a heterodyne receiver according to an embodiment of this invention and portions which are the same as those of FIG. 1 are denoted by the same reference numerals. In this circuit, an amplitude level correction circuit 12 is added to the conventional circuit construction shown in FIG. 1 and an output of the amplitude level correction circuit is supplied to a mixer 4. The amplitude level correction circuit 12 is controlled by an output signal of a detector 6.

Specifically, a local oscillator 15 constructed by a phase-locked loop (PLL) circuit includes a voltage-controlled oscillator (VCO) 7, OSC buffer amplifier 8, prescaler buffer amplifier 9, phase comparator circuit 10, and amplitude level correction circuit 12. In the local oscillator 15, the VCO 7 creates a local oscillation signal in synchronism with a signal input from a frequency selection circuit 11. The buffer amplifier 8 amplifies the local oscillation signal supplied from the VCO 7 and supplies the amplified signal to the amplitude level correction circuit 12. The amplitude level correction circuit 12 is controlled by an output signal of detector 6, and corrects the amplitude level of the amplified signal from the buffer amplifier 8 to output an amplitude level corrected signal to a frequency mixing circuit (which is hereinafter simply referred to as a mixer) 4.

A received high frequency input signal Si is supplied to a band-pass filter (BPF) 2a via an automatic gain control (AGC) circuit 1 whose gain is controlled based on an output of a detector 6. An output signal of the band-pass filter 2a is amplified by a high frequency amplifier (RF Amp) 3 and input to the mixer 4. In the mixer 4, the amplified high frequency input signal and the amplitude level corrected local oscillation signal from the amplitude level correction circuit 12 are mixed and an intermediate frequency signal is output. The intermediate frequency signal is amplified by an intermediate frequency amplifier (IF Amp) 5 and input to the detector 6 via a band-pass filter 2b which passes the intermediate frequency signal.

FIG. 7 is a circuit diagram showing the amplitude level correction circuit 12 of this invention connected to the output terminal of the buffer amplifier 8. In the example of FIG. 7, the amplitude level correction circuit 12 is of a parallel-output type (two-path output type). The amplitude level correction circuit 12 is connected to the succeeding stage of the emitter follower of the conventional local oscillator buffer amplifier 8 and constructed by six elements including transistors Q1 and Q2, and resistors R1 to R4. More specifically, the collector of the transistor Q1 is connected to the emitter of a transistor Q3 constituting the emitter follower circuit via the resistor R1 and to one of the input terminals (the base of a transistor Q5 of a differential amplifier) of the mixer 4 which is of double-balanced type as shown in FIG. 7, for example. The emitter of the transistor Q1 is grounded via the resistor R2. The collector of the transistor Q2 is connected to the emitter of a transistor Q4 constituting the output terminal of the emitter follower circuit via the resistor R3 and to the other input terminal (the base of a transistor Q6 of the differential amplifier) of the mixer 4. The emitter of the transistor Q2 is grounded via the resistor R4. The bases of the transistors Q1, Q2 are supplied with an output signal of the detector 6.

In FIG. 7, the mixer 4 is a double-balanced type, the base of the transistor Q5 of one of the amplifiers of a double-balanced type amplifier section constitutes an input section of the mixer, and the base of the transistor Q6 of the other amplifier constitutes the other input section of the mixer. Therefore, one of the outputs of the amplitude level correction circuit 12 is input to the base of the transistor Q5 and the other output thereof is input to the base of the transistor Q6. As the mixer 4, a single-balanced type circuit as shown in FIG. 8 can be used. In the circuit of FIG. 8, the outputs of the amplitude level correction circuit 12 are input to the bases of transistors Q7, Q8 of the single-balanced type amplifier section of the mixer 4.

Figure 10:
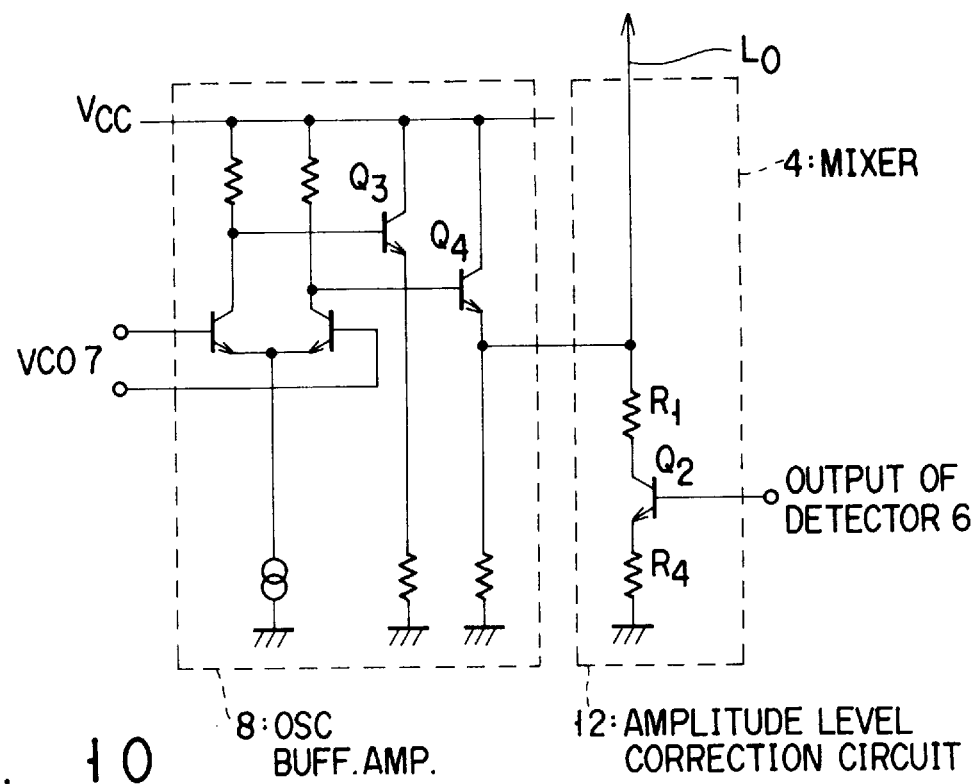
FIG. 10 is a circuit diagram showing still another example of the amplitude level correction circuit 12 shown in FIG. 7.
Figure 11:
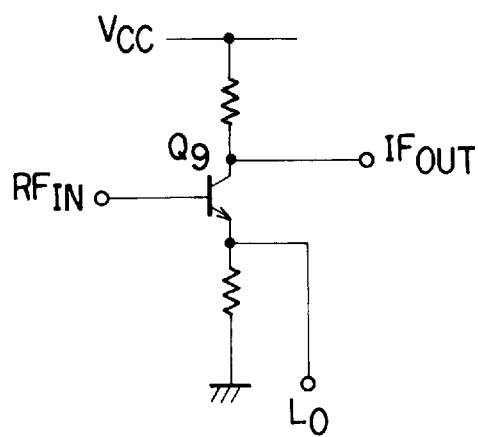
FIG. 11 is a circuit diagram showing a single-bipolar type mixer.
Figure 12:
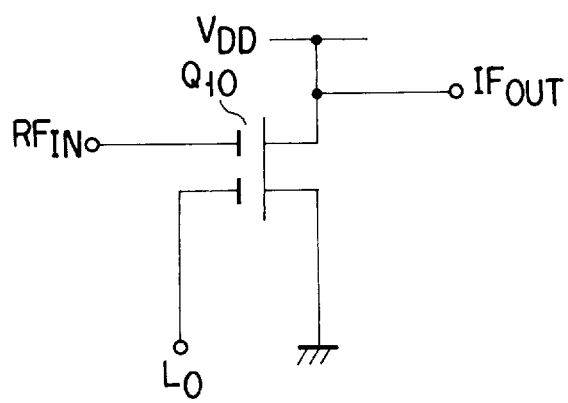
FIG. 12 is a circuit diagram showing a single-MOSFET type mixer.

In the circuit of FIG. 7, the amplitude level correction circuit includes a two-path circuit corresponding to a two-path transistor-resistor circuit (a circuit path of the transistor Q3 and the resistor R5 and a circuit path of the transistor Q4 and the resistor R6) constructing the emitter follower circuit of the OSC buffer amplifier 8, that is, it is constructed by a circuit path of the transistor Q1 and the resistors R1, R2 and a circuit path of the transistor Q2 and the resistors R3, R4. However, as shown in FIG. 9, the amplitude level correction circuit can be constructed by a single-path circuit. That is, as shown in FIG. 9, the amplitude level correction circuit can be constructed by only the circuit path of the transistor Q1 and the resistors R1, R2. Alternatively, as shown in FIG. 10, the amplitude level correction circuit can be constructed by only the circuit path of the transistor Q2 and the resistors R3, R4. In these cases, however, a single bipolar type circuit shown in FIG. 11 or a single FET type circuit shown in FIG. 12 is used as the mixer 4 instead of the double-balanced type circuit or single-balanced type circuit shown in FIG. 7 or 8. In the single bipolar type circuit shown in FIG. 11, a high-frequency input signal is supplied to the base of a transistor Q9, an output LO of the amplitude level correction circuit 12 is supplied to the emitter thereof and an intermediate frequency output IFout is output from the collector thereof. In the FET type circuit shown in FIG. 12, a high frequency input signal is supplied to one of the dual gates of a MOSFET Q10, an output LO of the amplitude level correction circuit 12 is supplied to the other dual gate, and an intermediate frequency signal IFout is output from the collector thereof.

Next, the function of the circuit of this invention is explained with reference to FIG. 7. The amplitude level of a local oscillation signal amplified by the buffer amplifier 8 is adjusted at the output terminal of the emitter follower circuit according to an output signal of the detector 6. The driving ability of the buffer amplifier 8 for the load impedance can be changed by adjusting the idling current of the emitter follower circuit. That is, the equivalent resistance of the emitter resistor of the emitter follower circuit can be changed by controlling the ON and OFF states of the transistors Q1, Q2 of the amplitude level correction circuit 12 according to the output signal of the detector 6, and as a result, the driving ability of the buffer amplifier 8 can be changed. Thus, the amplitude level correction circuit adjusts the idling current at the output stage of the emitter follower over a wide frequency range. As a result, the driving ability of the buffer amplifier 8 can be changed. That is, when the idling current is adjusted, the output impedance of the buffer amplifier 8 is kept unchanged but the dynamic range of the transistors Q3, Q4 of the emitter follower circuit is changed so as to change the amplitude level of the local oscillation signal input to the mixer.

Particularly, in a case where the load has a low impedance or where the reactance thereof increases due to high frequency, the amplitude level can be freely adjusted in a previously designed range and the reliability of the products can be enhanced.

FIG. 13 is a circuit diagram showing the concrete operation of a circuit of this invention in which the values of various elements, voltages and currents are specified. The circuit of FIG. 13 is created by extracting only a portion necessary for illustration from the circuit construction of FIG. 7 to simplify the illustration.

In the circuit of FIG. 13, a resistor R1 is used for preventing the load impedance as viewed from the output terminal of the emitter follower from being lowered so as to make negligible the reactance component of a capacitance Csub between the collector of a transistor Q1 and the substrate. Further, a capacitor C1 for preventing occurrence of parasitic oscillation is connected to the base of the transistor Q1. The resistances of the resistors R1, R2 are determined by taking the optimum range of the amplitude level of the local oscillation signal and the DC bias value of the amplitude level correction circuit 12 into consideration. The resistance of the resistor RI is set to a large value to prevent the load impedance from being lowered and the resistance of the resistor R2 is also set to a large value to prevent occurrence of parasitic oscillation due to the transistor operation.

When a detector output from the detector circuit is applied to a VS terminal of FIG. 13, a collector current is caused to flow in the transistor Q1. In the example of FIG. 13, an increase or decrease of 1 mA can be made by a change of 0.1V. That is, when VS is set at 0.9V, 1.0V or 1.1V, the collector current is respectively set to 2.0 mA, 3.0 mA or 4.0 mA.

In the system of the embodiment shown in FIG. 6, the detector output from the detector is fed back to the main circuit portion to correct the amplitude level of the local oscillation signal. As the mixer 4, a double-balanced type differential amplifier as shown in FIG. 7 is used which has such a characteristic that when the amplitude level of the local oscillation signal is raised, the conversion gain increases to some extent and then decreases and the modulation distortion is suppressed when the amplitude level is low. The intermediate frequency output is detected by a detector, and when the detected output signal becomes larger, a collector current flowing in the transistor Q1 of the amplitude level correction circuit 12 increases and a current in the emitter follower of the buffer amplifier decreases to reduce the magnitude of the local oscillation signal to the mixer and reduce the conversion gain. Further, when the detected output signal becomes smaller, the collector current flowing in the transistor Q1 of the amplitude level correction circuit 12 decreases and the current in the emitter follower of the buffer amplifier increases to increase the magnitude of the local oscillation signal to the mixer and increase the conversion gain.

Figure 4:
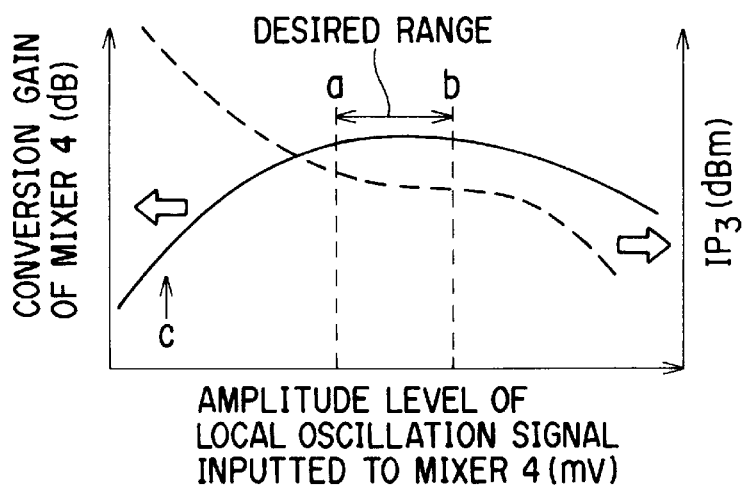
FIG. 4 is a diagram showing the relation between the amplitude level of the local oscillation signal input to the frequency mixer and the conversion gain and third modulation distortion.
Figure 5:
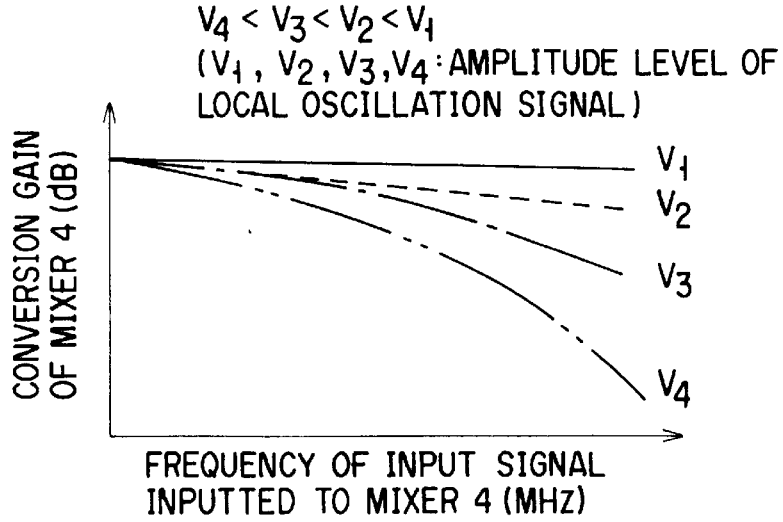
FIG. 5 is a diagram showing the relation between the frequency of a high-frequency input signal input to the frequency mixer 4 and the conversion gain of the mixer when the amplitude levels V1, V2, V3, V4 of the local oscillation signal are used as parameters.

FIG. 14 shows an embodiment in which this invention is applied to a PHS system. When the PHS system is placed and used in a place of high electric field strength, a high-level high-frequency input signal can be obtained. At this time, the operation required for the system is an operation with much stress on distortion, that is, an operation in which occurrence of the distortion for the high-frequency input signal can be suppressed to minimum. In a place of high electric field strength, since the detected output signal of the detector is made larger, the IP3 characteristic is enhanced by lowering the amplitude level of the local oscillation signal input to the mixer to a point "c" in FIG. 4 so as to lower the conversion gain. In this case, since the current in the emitter follower is reduced, the current consumption reducing operation can be attained. In a place of weak electric field, much stress is put on an increase in the gain of the system. At this time, since the magnitude of an output signal of the detector is reduced, the amplitude level of the local oscillation signal is raised to attain a preset conversion gain.

This invention is not limited to the above embodiments and can be applied to various types of mixers to attain a desired gain and a desired modulation distortion characteristic. As described above, according to this invention, the amplitude level of the local oscillation signal input to the mixer is adjusted by use of the amplitude level correction circuit which is connected to the output terminal of the OSC amplifier and controlled by a detected output. As a result, even if the frequency of the local oscillation signal or high-frequency input signal varies, the local oscillation signal of the optimum amplitude level can always be attained. Further, even when the system is moved to a place of different electric field strength, the optimum amplitude level can obtained according to the electric field strength of the place and the current consumption can be reduced. Further, since an operation with much stress put on the conversion gain or an operation with much stress put on the IP3 (distortion) characteristic can be selected for the characteristic of the mixer, it becomes possible to attain a suitable operation according to the electric field strength of the place in which the system is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. An amplitude correction circuit comprising:

oscillating means for generating a local oscillation signal;

amplifying means for amplifying the local oscillation signal generated from said oscillating means;

mixing means for combining the local oscillation signal amplified by said amplifying means with a high-frequency input signal to create an intermediate frequency signal;

detecting means for detecting the intermediate frequency signal output from said mixing means; and control means connected between said amplifying means and said mixing means, for controlling the amplitude level of the local oscillation signal according to only an output signal of said detecting means.

2. The amplitude correction circuit according to claim 1, wherein said amplifying means includes an emitter follower circuit at the output stage thereof.

3. The amplitude correction circuit according to claim 1, wherein said control means includes a transistor having a collector connected to the local oscillation signal input terminal of said mixing means and an output terminal of an output stage circuit of said amplifying means via a first resistor, an emitter grounded via a second resistor, and a base supplied with an output signal of said detecting means.

4. The amplitude correction circuit according to claim 1, wherein said amplifying means includes a pair of emitter follower circuits at the output stage thereof and said control means includes a pair of transistors respectively connected between a reference potential node and output terminals of said pair of emitter follower circuits and controlled by an output of said detecting means.

5. The amplitude correction circuit according to claim 1, wherein said amplifying means includes a pair of emitter follower circuits at the output stage thereof and said control means includes a transistor connected between a reference potential node and an output terminal of one of said pair of emitter follower circuits and controlled by an output of said detecting means.

6. The amplitude correction circuit according to claim 1, wherein said amplifying means includes a pair of emitter follower circuits at the output stage thereof and said control means includes a first transistor having a collector connected to the local oscillation signal input terminal of said mixing means and the output terminal of one of said emitter follower circuits via a first resistor, an emitter grounded via a second resistor, and a base supplied with an output signal of said detecting means; and a second transistor having a collector connected to the local oscillation signal input terminal of said mixing means and the output terminal of the other emitter follower circuit via a third resistor, an emitter grounded via a fourth resistor, and a base supplied with an output signal of said detecting means.

7. The amplitude correction circuit according to claim 1, wherein said amplifying means includes a pair of emitter follower circuits at the output stage thereof and said control means includes a transistor having a collector connected to the local oscillation signal input terminal of said mixing means and the output terminal of one of said emitter follower circuits via a first resistor, an emitter grounded via a second resistor, and a base supplied with an output signal of said detecting means.

8. The amplitude correction circuit according to claim 1, wherein said mixing means includes a double-balanced type differential amplifier.

9. The amplitude correction circuit according to claim 1, wherein said mixing means includes a single-balanced type differential amplifier.

10. The amplitude correction circuit according to claim 1, wherein said mixing means includes a single bipolar transistor.

11. The amplitude correction circuit according to claim 1, wherein said mixing means includes a single FET of dual gate type.

12. The amplitude correction circuit according to claim 1, wherein said control means lowers the amplitude of the local oscillation signal according to an output signal of said detecting means when the strength of a received high-frequency input signal is higher than a preset strength and increases the amplitude of the local oscillation signal according to an output signal of said detecting means when the strength of the received high-frequency input signal is lower than the preset strength.

13. An amplitude correction circuit comprising:

oscillating means for generating a local oscillation signal;

amplifying means for amplifying the local oscillation signal generated from said oscillating means;

mixing means for combining the local oscillation signal amplified by said amplifying means with a high-frequency input signal to create an intermediate frequency signal;

detecting means for detecting the intermediate frequency signal output from said mixing means; and control means connected between said amplifying means and said mixing means, for controlling the amplitude level of the local oscillation signal according to an output signal of said detecting means;

wherein said control means includes a transistor having a collector connected to the local oscillation signal input terminal of said mixing means and an output terminal of an output stage circuit of said amplifying means via a first resistor, an emitter grounded via a second resistor, and a base supplied with an output signal of said detecting means.

14. An amplitude correction circuit comprising:

oscillating means for generating a local oscillation signal;

amplifying means for amplifying the local oscillation signal generated from said oscillating means;

mixing means for combining the local oscillation signal amplified by said amplifying means with a high-frequency input signal to create an intermediate frequency signal;

detecting means for detecting the intermediate frequency signal output from said mixing means; and control means connected between said amplifying means and said mixing means, for controlling the amplitude level of the local oscillation signal according to an output signal of said detecting means;

wherein said amplifying means includes a pair of emitter follower circuits at an output stage thereof and said control means includes a pair of transistors respectively connected between a reference potential node and output terminals of said pair of emitter follower circuits and controlled by an output of said detecting means.

15. An amplitude correction circuit comprising:

oscillating means for generating a local oscillation signal;

amplifying means for amplifying the local oscillation signal generated from said oscillating means;

mixing means for combining the local oscillation signal amplified by said amplifying means with a high-frequency input signal to create an intermediate frequency signal;

detecting means for detecting the intermediate frequency signal output from said mixing means; and control means connected between said amplifying means and said mixing means, for controlling the amplitude level of the local oscillation signal according to an output signal of said detecting means;

wherein said amplifying means includes a pair of emitter follower circuits at an output stage thereof and said control means includes a transistor connected between a reference potential node and an output terminal of one of said pair of emitter follower circuits and controlled by an output of said detecting means.

16. An amplitude correction circuit comprising:

oscillating means for generating a local oscillation signal;

amplifying means for amplifying the local oscillation signal generated from said oscillating means;

mixing means for combining the local oscillation signal amplified by said amplifying means with a high-frequency input signal to create an intermediate frequency signal;

detecting means for detecting the intermediate frequency signal output from said mixing means; and control means connected between said amplifying means and said mixing means, for controlling the amplitude level of the local oscillation signal according to an output signal of said detecting means;

wherein said amplifying means includes a pair of emitter follower circuits at an output stage thereof and said control means includes a first transistor having a collector connected to a local oscillation signal input terminal of said mixing means and an output terminal of one of said emitter follower circuits via a first resistor, an emitter grounded via a second resistor, and a base supplied with an output signal of said detecting means; and a second transistor having a collector connected to the local oscillation signal input terminal of said mixing means and an output terminal of the other emitter follower circuit via a third resistor, an emitter grounded via a fourth resistor, and a base supplied with the output signal of said detecting means.

17. An amplitude correction circuit comprising:

oscillating means for generating a local oscillation signal;

amplifying means for amplifying the local oscillation signal generated from said oscillating means;

mixing means for combining the local oscillation signal amplified by said amplifying means with a high-frequency input signal to create an intermediate frequency signal;

detecting means for detecting the intermediate frequency signal output from said mixing means; and control means connected between said amplifying means and said mixing means, for controlling the amplitude level of the local oscillation signal according to an output signal of said detecting means;

wherein said amplifying means includes a pair of emitter follower circuits at an output stage thereof and said control means includes a transistor having a collector connected to a local oscillation signal input terminal of said mixing means and an output terminal of one of said emitter follower circuits via a first resistor, an emitter grounded via a second resistor, and a base supplied with an output signal of said detecting means.

* * * * *